(12) United States Patent
Kono et al.

(10) Patent No.: US 11,785,718 B2
(45) Date of Patent: Oct. 10, 2023

(54) COMPOSITE PRINTED WIRING BOARD AND METHOD OF MANUFACTURING THE SAME

(71) Applicant: Mitsubishi Electric Corporation, Tokyo (JP)

(72) Inventors: Takamichi Kono, Tokyo (JP); Hitoshi Arai, Tokyo (JP); Tatsuya Sakamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 67 days.

(21) Appl. No.: 17/429,353

(22) PCT Filed: Mar. 26, 2020

(86) PCT No.: PCT/JP2020/013737
§ 371 (c)(1),
(2) Date: Aug. 9, 2021

(87) PCT Pub. No.: WO2020/203665
PCT Pub. Date: Oct. 8, 2020

(65) Prior Publication Data
US 2022/0151072 A1 May 12, 2022

(30) Foreign Application Priority Data
Apr. 2, 2019 (JP) .................. 2019-070716

(51) Int. Cl.
*H05K 1/14* (2006.01)
*H05K 3/36* (2006.01)
*H05K 3/46* (2006.01)

(52) U.S. Cl.
CPC ............. *H05K 1/144* (2013.01); *H05K 3/368* (2013.01); *H05K 3/4644* (2013.01); *H05K 2201/042* (2013.01)

(58) Field of Classification Search
CPC ...... H05K 1/144; H05K 3/368; H05K 3/4644; H05K 2201/042
(Continued)

(56) References Cited

U.S. PATENT DOCUMENTS

2010/0246148 A1  9/2010  Ikeda et al.
2015/0173191 A1* 6/2015  Takahashi ............... H05K 1/11
                                                    156/247
(Continued)

FOREIGN PATENT DOCUMENTS

JP   H6-275774 A    9/1994
JP   2001-111232 A  4/2001
(Continued)

OTHER PUBLICATIONS

Office Action dated Nov. 16, 2022, in corresponding Japanese patent Application No. 2021-511937 (Japanese patent No. 6932289), 47 pages.
(Continued)

*Primary Examiner* — Andargie M Aychillhum
(74) *Attorney, Agent, or Firm* — XSENSUS LLP

(57) ABSTRACT

A composite printed wiring board that allows for reflow heating for mounting electronic components using solder includes a first printed wiring board, an intermediate member, a second printed wiring board, and a bonding layer. The intermediate member is stacked on the first printed wiring board. The intermediate member has a cavity. The second printed wiring board is stacked on a surface on the opposite side to a surface opposed to the first printed wiring board in the intermediate member. The bonding layer is arranged at a bonding section between the first printed wiring board and the intermediate member and at a bonding section between the second printed wiring board and the intermediate member. The bonding layer contains high melting point metal and
(Continued)

low melting point metal. The melting point of the bonding layer is higher than the melting point of the low melting point metal.

12 Claims, 16 Drawing Sheets

(58) Field of Classification Search
USPC .......................................................... 361/804
See application file for complete search history.

(56) References Cited

U.S. PATENT DOCUMENTS

| 2016/0095218 | A1 | | 3/2016 | Sakurai | |
|---|---|---|---|---|---|
| 2018/0124928 | A1 | * | 5/2018 | Rathburn | ............... H05K 3/425 |

FOREIGN PATENT DOCUMENTS

| JP | 2001-156222 | A | | 6/2001 | |
|---|---|---|---|---|---|
| JP | 2001-177235 | A | | 6/2001 | |
| JP | 2001-210954 | A | | 8/2001 | |
| JP | 2004-22973 | A | | 1/2004 | |
| JP | 2004022973 | A | * | 1/2004 | |
| JP | 2004-297053 | A | | 10/2004 | |
| JP | 2005-136339 | A | | 5/2005 | |
| JP | 2008-41910 | A | | 2/2008 | |
| JP | 2008041910 | A | * | 2/2008 | ............. H01G 4/005 |
| JP | 2009-141197 | A | | 6/2009 | |
| JP | 2011-151348 | A | | 8/2011 | |
| JP | 2012253195 | A | * | 12/2012 | ............. H01G 4/005 |
| JP | 2013-206973 | A | | 10/2013 | |
| JP | 2016-46430 | A | | 4/2016 | |
| JP | 2016-066699 | A | | 4/2016 | |
| JP | 2016046430 | A | * | 4/2016 | |
| JP | 2018-093001 | A | | 6/2018 | |

OTHER PUBLICATIONS

Office Communication dated Nov. 16, 2022, in corresponding Japanese patent No. 6932289, 28 pages.

Office Action dated Jun. 22, 2022, in corresponding Japanese patent Application No. 2021-511937, 23 pages.

Notice of Opposition issued on Mar. 30, 2022, in corresponding Japanese patent No. 6932289, 122 pages.

T. Osawa, "Soldering Technology Why Why 100 Questions", Kogyo Chosakai Publishing Co., Ltd., May 15, 1996, pp. 34-37 and pp. 84-89, with English Machine translation of relevant portion, total 10 pages.

W. Tanaka, "Key Points of Soldering Work", The Nikkan Kogyo Shimbun, Feb. 28, 1981, pp. 1-3 and pp. 8-18, with English Machine translation of relevant portion, total 13 pages.

M. Nose, "Color Version Convinced by Eye! Soldering Work", The Nikkan Kogyo Shimbun, Mar. 2021, pp. 12-17, with English Machine translation of relevant portion, total 6 pages.

"Color Version Convinced by Eye! Soldering Work", Nikkan Book Store, Nikkan Kogyo Shimbun, https://pub.nikkan.co.jp/books/detail/00003565, with English Machine translation of relevant portion, total 4 pages.

S. Ito, "Consideration of the Relationship Between Fatigue Life and Diffusion of Lead-free Solder", REAJ 16th Spring Symposium on Reliability, Reliability Engineering Association of Japan, May 30, 2008, with English Machine translation of relevant portion, total 6 pages.

J-Global, https://jglobal.jst.go.jp/detail?JGLOBAL_ID=200902210469830825, Reliability Engineering Association of Japan, with English Machine translation of relevant portion, total 2 pages.

S. Fukumoto, "Development of Nano-thermite Reaction Bonding Method for Power Semiconductor Mounting", Research Results Report of Grant-in-Aid for Scientific Research, https://kaken.nii.ac.jp/ja/file/KAKENHI-PROJECT-, Jun. 8, 2015, with English Machine translation of relevant portion, total 8 pages.

International Search Report and Written Opinion dated Jul. 7, 2020, received for PCT Application PCT/JP2020/013737, Filed on Mar. 26, 2020, 9 pages including English Translation.

Notice of Reasons for Revocation dated Mar. 24, 2023, in corresponding Japanese patent Application No. 2021-511937, 20 pages.

Notice of Written Opinion dated Mar. 24, 2023, in corresponding Japanese patent No. 6932289, 19 pages.

* cited by examiner

COMPOSITE PRINTED WIRING BOARD AND METHOD OF MANUFACTURING THE SAME

CROSS-REFERENCE TO RELATED APPLICATIONS

The present application is based on PCT filing PCT/JP2020/013737, filed Mar. 26, 2020, which claims priority to JP 2019-070716, filed Apr. 2, 2019, the entire contents of each are incorporated herein by reference.

TECHNICAL FIELD

The present disclosure relates to a composite printed wiring board and a method of manufacturing the same.

BACKGROUND ART

In recent years, electronic devices such as portable terminals including wearable devices and smartphones have been downsized. With the downsizing of electronic devices, printed wiring boards for use in electronic devices and printed circuit boards populated with electronic components tend to be more sophisticated, smaller, denser, and miniaturized. For example, it is necessary to improve heat dissipation performance for printed wiring boards because electronic components generating heat are mounted on compact printed wiring boards. Then, composite printed wiring boards have been developed, in which printed wiring boards populated with electronic components are stacked with a medium having an electrical conduction path interposed. In such a composite printed wiring board, a space for heat dissipation is provided between printed wiring boards populated with electronic components. In the composite printed wiring board described above, solder is often used to bond the printed wiring boards to each other. For example, according to Japanese Patent Laying-Open No. 2001-210954, electronic components are mounted on printed wiring boards and thereafter the printed wiring boards with the electronic components mounted thereon are bonded by solder balls with a frame interposed.

CITATION LIST

Patent Literature

PTL 1: Japanese Patent Laying-Open No. 2001-210954

SUMMARY OF INVENTION

Technical Problem

However, in the structure described in the publication above, since the printed wiring boards are stacked using solder balls, the solder balls connecting the printed wiring boards to the frame may be melted by reflow heating for additionally mounting electronic components on the printed wiring boards after stacking the printed wiring boards, causing separation of the printed wiring boards from the frame.

The present disclosure is made in order to solve the problem described above, and an object of the present disclosure is to provide a composite printed wiring board that allows for reflow heating for mounting electronic components using solder.

Solution to Problem

A composite printed wiring board according to the present disclosure includes a first printed wiring board, an intermediate member, a second printed wiring board, and a mutual diffusion bonding layer. The intermediate member is stacked on the first printed wiring board. The intermediate member has a cavity. The second printed wiring board is stacked on a surface on an opposite side to a surface opposed to the first printed wiring board in the intermediate member. The mutual diffusion bonding layer is arranged at a bonding section between the first printed wiring board and the intermediate member and at a bonding section between the second printed wiring board and the intermediate member. The bonding layer contains high melting point metal and low melting point metal. The melting point of the bonding layer is higher than the melting point of the low melting point metal.

A method of manufacturing a composite printed wiring board according to the present disclosure includes a step of preparing a stack in which a first printed wiring board, an intermediate member having a cavity, and a second printed wiring board are stacked. In the step of preparing a stack, a stack structure including a layer containing high melting point metal and a layer containing low melting point metal is formed at a contact region between the first printed wiring board and the intermediate member and at a contact region between the second printed wiring board and the intermediate member. The method of manufacturing a composite printed wiring board further includes a step of forming a bonding layer by heating the stack to a temperature equal to or higher than a melting point of the low melting point metal to cause mutual diffusion of the high melting point metal and the low melting point metal in the stack structure.

Advantageous Effects of Invention

The description above provides a composite printed wiring board that allows for reflow heating for mounting electronic components using solder.

DESCRIPTION OF EMBODIMENTS

Figure 1:
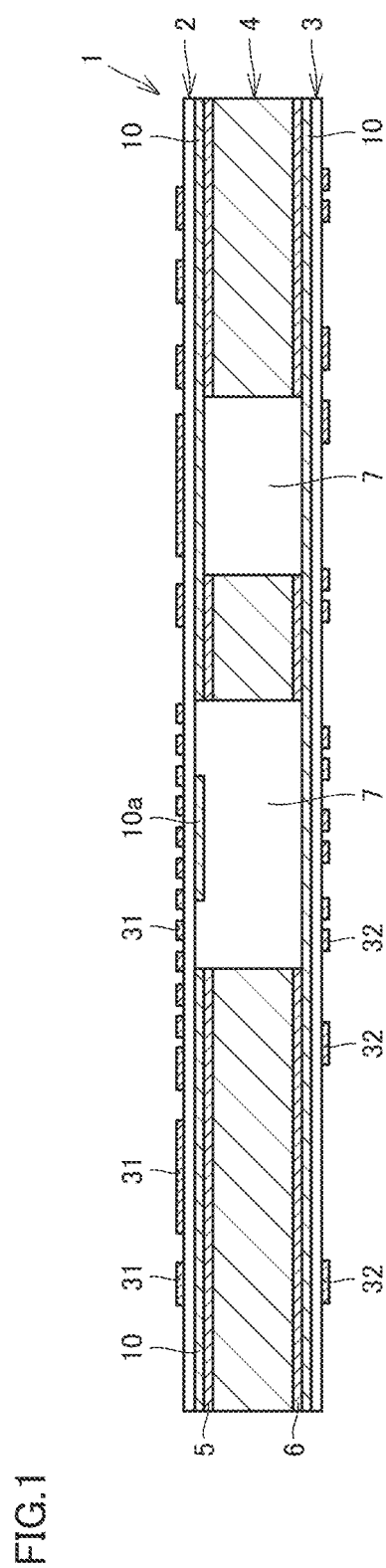
FIG. 1 is a cross-sectional view of a composite printed wiring board according to a first embodiment.

Embodiments of the present disclosure will be described below with reference to the accompanying drawings. Corresponding parts in the following drawings are denoted by like reference numerals and a description thereof will not be repeated.

First Embodiment

<Configuration of Composite Printed Wiring Board>

FIG. 1 is a cross-sectional view of a composite printed wiring board according to a first embodiment. A composite printed wiring board 1 shown in FIG. 1 mainly includes a first printed wiring board 2, an intermediate member 4, a second printed wiring board 3, and bonding layers 5 and 6.

Figure 5:
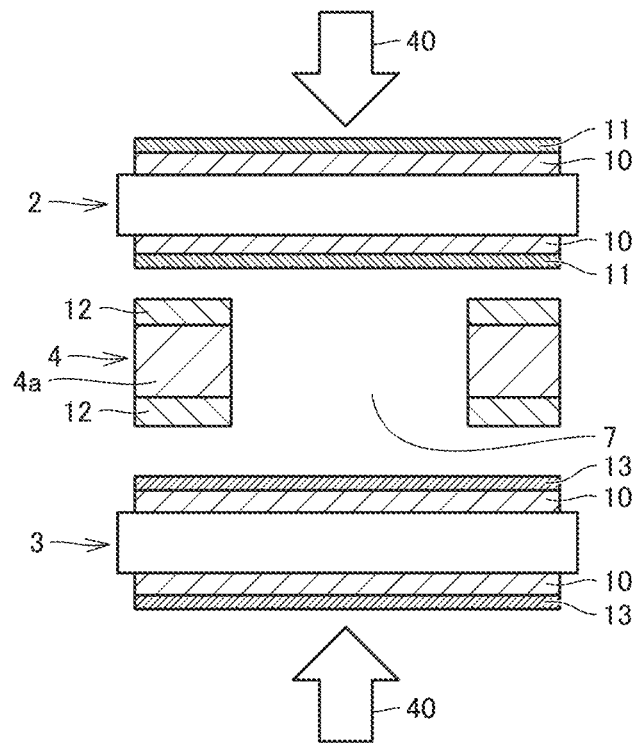
FIG. 5 is a diagram for explaining a method of manufacturing the composite printed wiring board shown in FIG. 1.

First printed wiring board 2 is a multilayer printed wiring board and has a wiring layer 31 made of a conductor on a surface of an insulating substrate made of an insulator such as resin. Wiring layer 31 may be, for example, a multilayered structure including a copper foil 10 and a plating layer 11 as shown in FIG. 5 described later. Copper foil 10 is formed on a back surface on the opposite side to a front surface having wiring layer 31 in the insulating substrate. The thickness of copper foil 10 is, for example, about 18 μm. Plating layer 11 may be formed on copper foil 10 as shown in FIG. 5. Plating layer 11 is formed, for example, for preventing corrosion of copper foil 10. Plating layer 11 is, for example, Ni/Au flash plating.

Intermediate member 4 is stacked on first printed wiring board 2. Specifically, intermediate member 4 is formed on the back surface side having copper foil 10 in first printed wiring board 2. Bonding layer 5 is arranged between intermediate member 4 and first printed wiring board 2. Bonding layer 5 is a mutual diffusion layer formed by liquid phase diffusion of high melting point metal and low melting point metal. Bonding layer 5 connects first printed wiring board 2 and intermediate member 4. That is, bonding layer 5 is arranged at a connection between first printed wiring board 2 and intermediate member 4. As used herein the high melting point metal refers to a metal having a relatively higher melting point than low melting point metal, and examples include copper (Cu), nickel (Ni), iron (Fe), chromium (Cr), silver (Ag), and alloys thereof. The low melting point metal refers to a metal having a melting point lower than the high melting point metal, and examples include tin (Sn), bismuth (Bi), indium (In), and alloys thereof.

Intermediate member 4 has a cavity 7. Cavity 7 serves as a path for radio waves and a cooling medium. Cavity 7 may be formed, for example, by machining such as spot facing. Intermediate member 4 is formed of, for example, metal. The metal that forms intermediate member 4 may be a high melting point metal that forms bonding layer 5 described above.

In intermediate member 4 shown in FIG. 1, the outer periphery of cavity 7 formed on the left side is partially covered with metal. Specifically, on the outer periphery of cavity 7 on the side closer to first printed wiring board 2, a copper foil portion 10a is formed on the insulating substrate of first printed wiring board 2. At a portion adjacent to copper foil portion 10a, a surface of the insulating substrate is exposed. The other portion of the outer periphery of the cavity 7 is formed with copper foil 10 of second printed wiring board 3, intermediate member 4, and bonding layers 5 and 6. On the other hand, the outer periphery of cavity 7 formed on the right side in intermediate member 4 is covered with metal. Specifically, the outer periphery of the cavity 7 is covered with metal such as copper foil 10 of first printed wiring board 2, copper foil 10 of second printed wiring board, intermediate member 4, and bonding layers 5 and 6.

Second printed wiring board 3 is a multilayer printed wiring board and stacked on a surface on the opposite side to the surface opposed to first printed wiring board 2 in intermediate member 4. The configuration of second printed wiring board 3 is basically similar to the configuration of first printed wiring board 2. That is, second printed wiring board 3 has a wiring layer 32 made of a conductor on a surface of an insulating substrate. Wiring layer 32 may be a configuration similar to wiring layer 31. That is, wiring layer 32 may be a stack structure including a copper foil 10 and a plating layer 13 as shown in FIG. 5. Copper foil 10 is formed on a back surface on the opposite side to a front surface having wiring layer 32 in the insulating substrate. Plating layer 13 may be formed on copper foil 10 as shown in FIG. 5. A surface on the side having copper foil 10 in second printed wiring board 3 is opposed to intermediate member 4.

Bonding layer 6 is arranged at a bonding section between second printed wiring board 3 and intermediate member 4. Bonding layer 6 contains high melting point metal and low melting point metal. Bonding layer 6 may basically have a composition similar to bonding layer 5. The melting point of bonding layers 5 and 6 is higher than the melting point of the low melting point metal that forms bonding layers 5 and 6. That is, in bonding layers 5 and 6, the low melting point metal is melted and diffused in the high melting point metal or an alloy thereof described above, whereby the melting point of bonding layers 5 and 6 is higher than the melting point of the low melting point metal. For example, when tin (Sn) is used as low melting point metal, the melting point of bonding layers 5 and 6 can be set to a temperature, for example, exceeding 260° C. Therefore, when solder reflowing is performed for mounting electronic components on composite printed wiring board 1, bonding layers 5 and 6 of composite printed wiring board 1 are not melted even at heating temperatures in solder reflowing (240° C. to 260° C.).

In terms of improving the reliability of the bonding sections between first printed wiring board 2, intermediate member 4, and second printed wiring board 3, it is preferable that the area of bonding layers 5 and 6 in a two-dimensional view of composite printed wiring board 1 is as large as possible.

<Configuration of Composite Printed Circuit Board>

Figure 2:
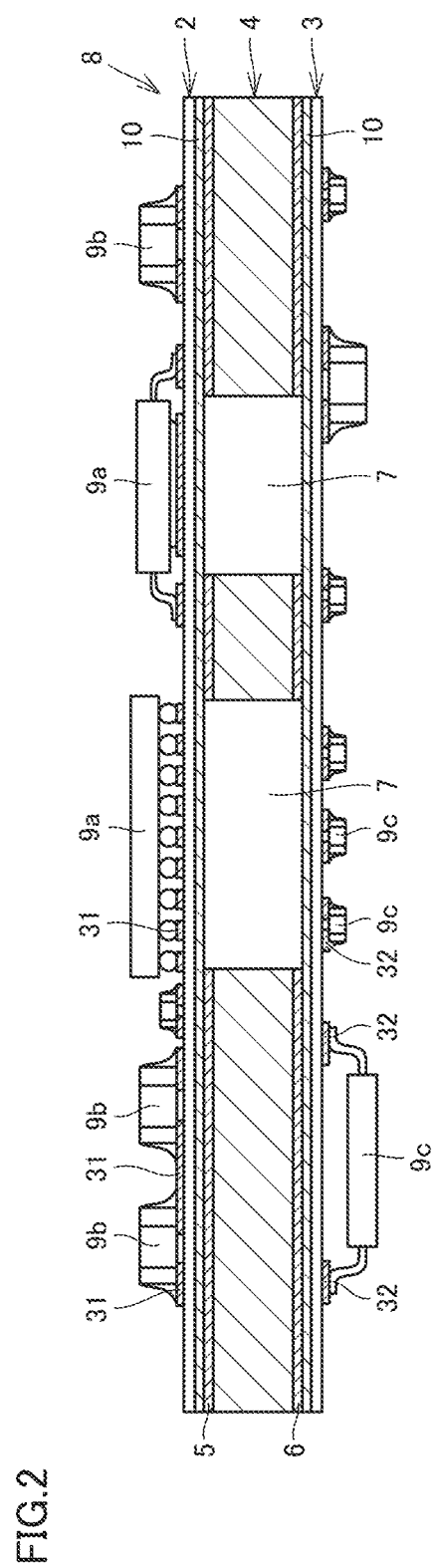
FIG. 2 is a cross-sectional view of the composite printed circuit board according to the first embodiment.

FIG. 2 is a cross-sectional view of a composite printed circuit board according to the first embodiment. A composite printed circuit board 8 shown in FIG. 2 is obtained by mounting electronic component 9a to 9c on wiring layers 31 and 32 of the composite printed wiring board according to the present embodiment. Electronic components 9a to 9c are bonded to wiring layers 31 and 32, for example, by a reflow soldering process. Electronic component 9a is, for example, a heat generating component such as a power semiconductor. Electronic component 9a is arranged at a region overlapping with cavity 7 serving as a channel for a cooling medium in a two-dimensional view of composite printed circuit board 8. In this way, electronic component 9a can be efficiently cooled. Cavity 7 may be used as a waveguide.

The outer periphery of cavity 7 in intermediate member 4 shown in FIG. 2 is entirely covered with metal. However, as shown in FIG. 1, the outer periphery of cavity 7 may be partially covered with metal.

<Configuration of Intermediate Member>

Figure 3:
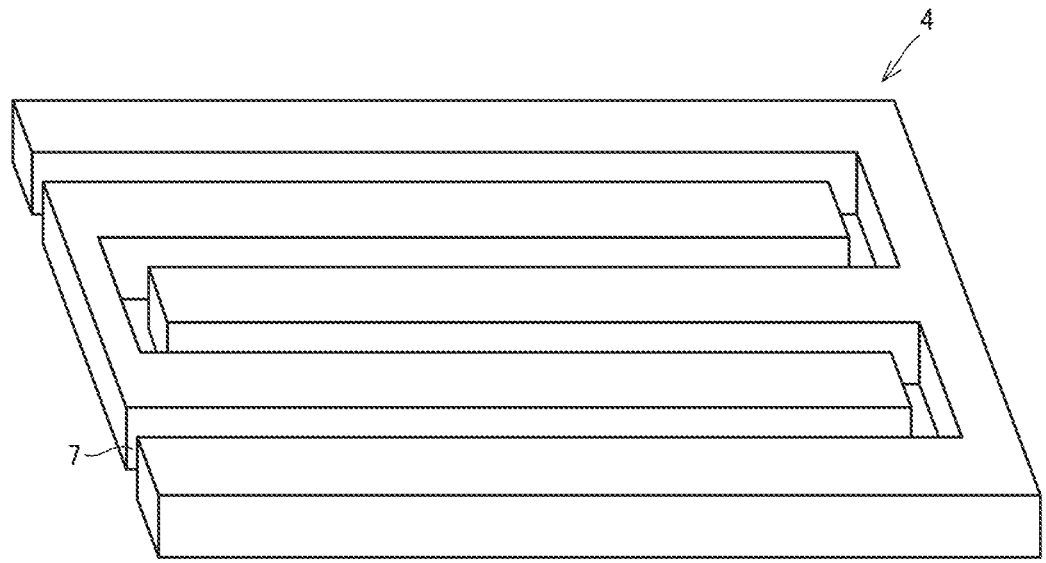
FIG. 3 is a perspective view of an intermediate member included in the composite printed wiring board shown in FIG. 1.

FIG. 3 is a perspective view of the intermediate member included in the composite printed wiring board shown in FIG. 1. Intermediate member 4 shown in FIG. 3 is made of metal and has cavity 7 serving as a groove. As shown in FIG. 3, cavity 7 is a bending channel having two openings on a side surface of intermediate member 4 and connecting the two openings. In such a cavity 7, for example, a cooling medium such as cooling air can be introduced from one of the openings and the cooling medium can be discharged from the other opening. Cavity 7 may be used as a waveguide serving as a path for radio waves. Intermediate member 4 may have cavity 7 that is a tubular hole.

<Method of Manufacturing Composite Printed Wiring Board>

Figure 4:
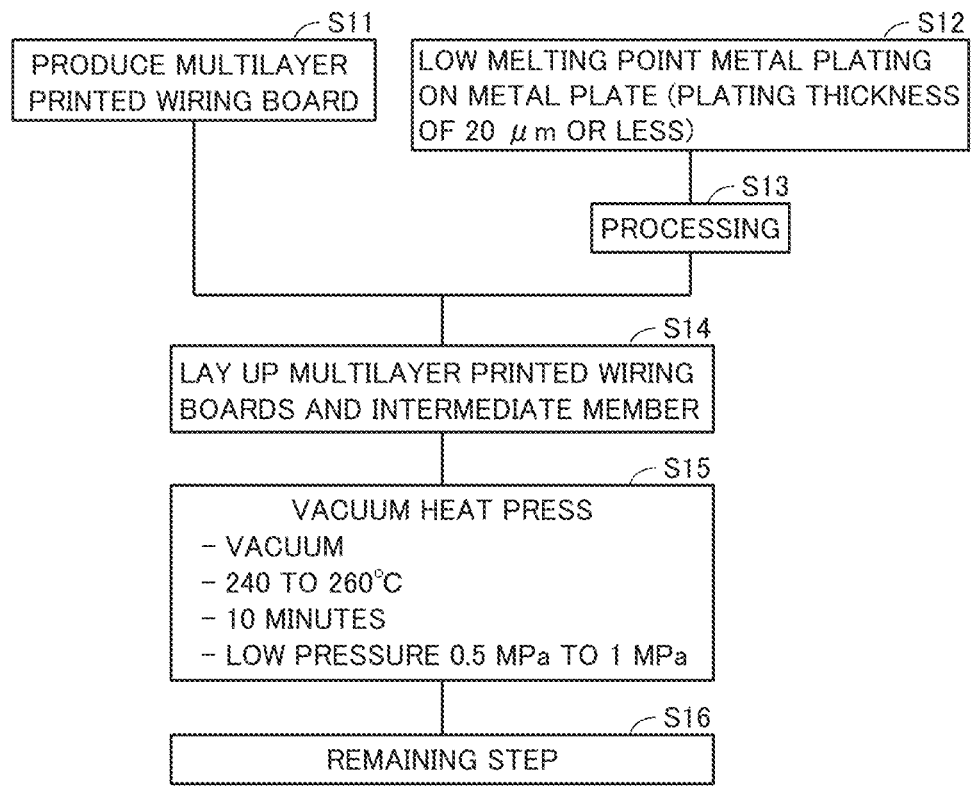
FIG. 4 is a flowchart for explaining a method of manufacturing a composite printed wiring board according to the first embodiment.
Figure 6:
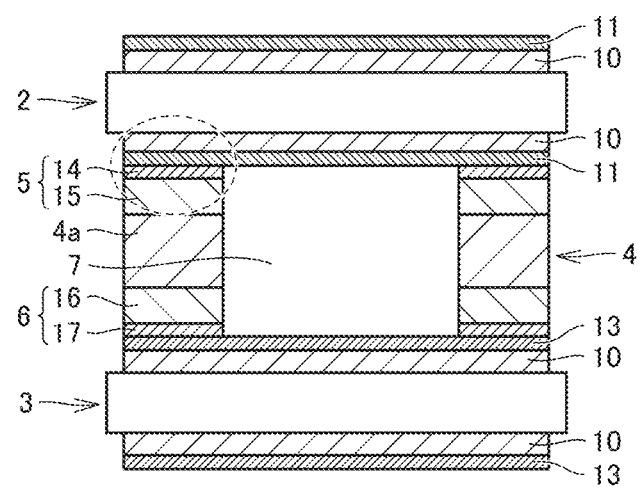
FIG. 6 is a diagram for explaining the method of manufacturing the composite printed wiring board shown in FIG. 1.

FIG. 4 is a flowchart for explaining a method of manufacturing a composite printed wiring board according to the first embodiment. FIG. 5 and FIG. 6 are diagrams for explaining a method of manufacturing the composite printed wiring board shown in FIG. 1. Referring to FIG. 4 to FIG. 6, a method of manufacturing a composite printed wiring board will be described.

As shown in FIG. 4, first, a step of producing a multilayer printed wiring board (S11) is performed. In this step (S11), multilayer printed wiring boards, namely, first printed wiring board 2 and second printed wiring board 3 are fabricated by a conventionally known method. Here, as shown in FIG. 5, plating layer 11 may be formed on a surface of copper foil 10 of first printed wiring board 2. Furthermore, as shown in FIG. 5, plating layer 13 may be formed on a surface of copper foil 10 of second printed wiring board 3. For example, Ni/Au plating, Ni/Pd/Au plating, Au/Pd/Au plating, or Ag plating can be used as plating layers 11 and 13. When plating layers 11 and 13 contain, for example, nickel, bonding layers 5 and 6 are not generated from copper foils 10. In this step (S11), formation of solder resist is also performed.

Subsequently, a step of plating a metal plate with low melting point metal (S12) is performed. In this step (S12), as shown in FIG. 5, plating layers 12 are formed on the front surface and the back surface of a metal plate 4a serving as intermediate member 4. Plating layers 12 contain low melting point metal. Plating layers 12 are, for example, Sn plating layers. In order to obtain a uniform concentration distribution in bonding layers 5 and 6, the thickness of plating layer 12 is set to, for example, 20 μm or less. A surface of metal plate 4a may be electroplated with high melting point metal such as Ag and thereafter plating layer 12 described above may be formed on the plating layer of high melting point metal.

Subsequently, a processing step (S13) is performed. In this step (S13), cavity 7 is formed in intermediate member 4. In formation of cavity 7, a conventionally known machining method such as cutting such as boring and spot facing can be used. The step of plating a metal plate with low melting point metal (S12) and the processing step (S13) may be performed in reverse order.

Subsequently, a step of laying up the multilayer printed wiring boards and the intermediate member (S14) is performed. In this step (S14), as shown in FIG. 5, a stack is obtained by stacking first printed wiring board 2, intermediate member 4, and second printed wiring board 3. Here, a stack structure including a layer containing high melting point metal (a region adjacent to plating layer 12 in metal plate 4a) and plating layer 12 that is a layer containing low melting point metal is formed at a contact region between first printed wiring board 2 and intermediate member 4 and a contact region between second printed wiring board 3 and intermediate member 4.

Subsequently, a vacuum heat press step (S15) is performed. In this step, the stack undergoes vacuum heat press to melt the low melting point metal in the stack structure and form intermetallic compound 15 and 16 which is a mutual diffusion layer of low melting point metal and high melting point metal by liquid phase diffusion. At regions adjacent to plating layers 11 and 13 in intermetallic compound 15 and 16, intermetallic compound 14 and 17 is formed in which an element (for example, nickel) of plating layers 11 and 13 is diffused. This intermetallic compound 14 to 17 serves as bonding layers 5 and 6. In bonding layers 5 and 6, for example, Ni is diffused in $Cu_6Sn_5$ (melting point 415° C.), $Cu_3Sn$ (melting point 680° C.), $Ni_3Sn_4$ (melting point 795° C.), or CuSn. In this way, since the melting point of bonding layers 5 and 6 is higher than solder reflowing temperatures (240° C. to 260° C.), electronic components can be soldered to composite printed wiring board 1. The structure shown in FIG. 6 is thus obtained. In this step (S15), the following conditions can be used: heating temperatures of 240° C. or higher and 260° C. or lower in a vacuum state, a heating hold time of 10 minutes, and a pressing force as low as 0.5 MPa or higher and 1 MPa or lower in the direction shown by the arrows 40 in FIG. 5.

In this step (S15), the melting point of bonding layers 5 and 6 is raised from the melting point of the low melting point metal. In the step (S15) above, satisfactory bonding characteristics in bonding layers 5 and 6 can be achieved by a vacuum. The heating temperature described above is preferably a relatively high temperature (for example, 240° C. or higher and 260° C. or lower described above in consideration of temperature variations) relative to the melting point (for example, the melting temperature of tin 232° C.) of the low melting point metal of plating layer 12. The heating hold time is set to about 10 minutes in consideration of in-plane temperature variations in first printed wiring board 2 and second printed wiring board 3. Such short heating hold time can suppress thermal decomposition of resin in the insulating substrates included in first printed wiring board 2 and the like. The pressing force should be set to a pressure that brings first printed wiring board 2 and second printed wiring board 3 into intimate contact with intermediate member 4. However, since there is cavity 7, it is desirable that the pressing force is set to a low pressure of 0.5 MPa or higher and 1 MPa or lower.

Subsequently, a remaining step for obtaining composite printed wiring board 1 (S16) is performed. In this step (S16), boring, trimming, and the like are performed for the structure obtained in the step (S15) above. Composite printed wiring board 1 shown in FIG. 1 is thus obtained. Formation of solder resist is performed in the step of producing a multilayer printed wiring board (S11) but may be performed in this step (S16).

<Operation Effect>

Composite printed wiring board 1 according to the present disclosure includes first printed wiring board 2, intermediate member 4, second printed wiring board 3, and bonding layers 5 and 6. Intermediate member 4 is stacked on first printed wiring board 2. Intermediate member 4 has cavity 7. Second printed wiring board 3 is stacked on a surface on the opposite side to a surface opposed to first printed wiring board 2 in intermediate member 4. Bonding layers 5 and 6 are arranged at a bonding section between first printed wiring board 2 and intermediate member 4 and a bonding section between second printed wiring board 3 and intermediate member 4. Bonding layers 5 and 6 contain high melting point metal and low melting point metal. The melting point of bonding layers 5 and 6 is higher than the melting point of the low melting point metal.

In this case, melting of bonding layers 5 and 6 by the solder reflowing process can be prevented when the solder reflowing temperature for mounting electronic components 9a, 9b, and 9c on composite printed wiring board 1 is approximately the melting point of the low melting point metal. Hence, even when the solder reflowing process is performed for mounting electronic components 9a, 9b, and 9c, problems such as disintegration of composite printed wiring board 1 due to melting of bonding layers 5 and 6 can be prevented.

Furthermore, because of cavity 7 formed in intermediate member 4, electronic component 9a mounted on composite printed wiring board 1 can be efficiently cooled by circulating a coolant such as cooling air through cavity 7. Cavity 7 can also be used for forming a shield space or a waveguide.

In composite printed wiring board 1 described above, intermediate member 4 is made of high melting point metal. In this case, intermediate member 4 can be used as a supply source of high melting point metal that forms bonding layers 5 and 6. This eliminates the need for forming a layer of high melting point metal in advance on a surface of intermediate member 4 in order to form bonding layers 5 and 6 and can simplify the manufacturing process of composite printed wiring board 1.

In composite printed wiring board 1 described above, as shown in FIG. 2, the outer periphery of cavity 7 is covered with metal. In this case, cavity 7 can be used as a channel for a coolant or a waveguide.

In composite printed wiring board 1 described above, as shown in FIG. 1, the outer periphery of cavity 7 is partially covered with metal. In this case, the permittivity and the dielectric loss tangent of composite printed wiring board 1 including cavity 7 can be adjusted by adjusting the arrangement and the area of metal covering the outer periphery of cavity 7.

The method of manufacturing a composite printed wiring board according to the present disclosure includes steps S11 to S14 for preparing a stack in which first printed wiring board 2, intermediate member 4 having a cavity, and second printed wiring board 3 are stacked. In steps S11 to S14 for preparing a stack, a stack structure including a layer containing high melting point metal (a region adjacent to plating layer 12 in metal plate 4a) and plating layer 12 that is a layer containing low melting point metal is formed at a contact region between first printed wiring board 2 and intermediate member 4 and a contact region between second printed wiring board 3 and intermediate member 4. The method of manufacturing composite printed wiring board 1 further includes step S15 for forming bonding layers 5 and 6 by heating the stack to a temperature equal to or higher than the melting point of the low melting point metal to cause mutual diffusion of the high melting point metal and the low melting point metal in the stack structure.

In this way, composite printed wiring board 1 according to the present disclosure described above can be obtained.

In the method of manufacturing a composite printed wiring board described above, intermediate member 4 is made of high melting point metal. Steps S11 to S14 for preparing a stack includes a step of forming plating layer 12 that is a layer made of low melting point metal on a surface of intermediate member 4. In this case, bonding layers 5 and 6 can be formed using intermediate member 4 serving as a supply source of high melting point metal that forms bonding layers 5 and 6.

Second Embodiment

<Configuration of Composite Printed Wiring Board>

Figure 7:
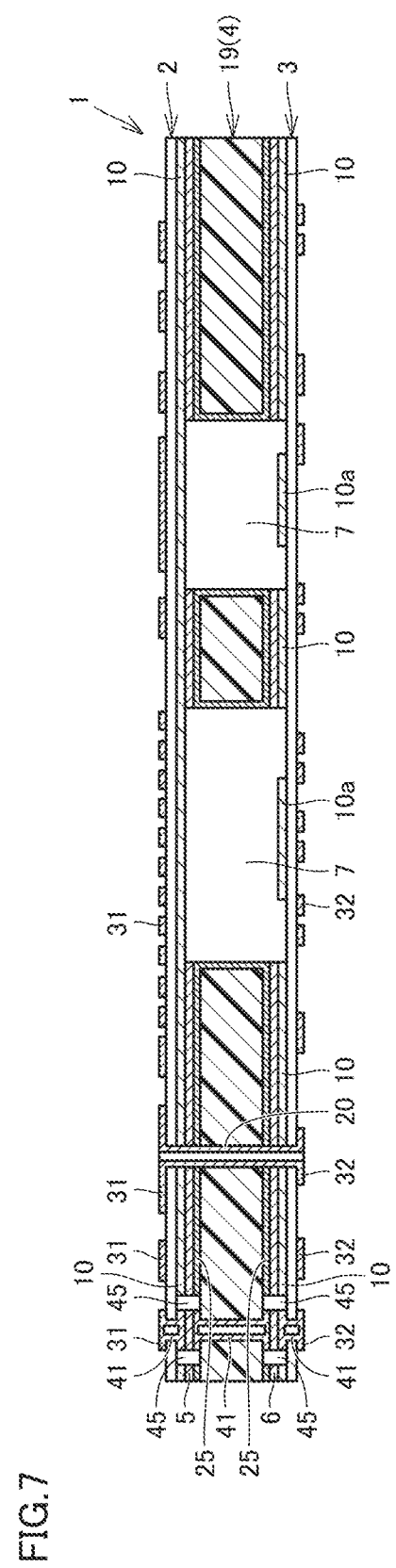
FIG. 7 is a cross-sectional view of a composite printed wiring board according to a second embodiment.

FIG. 7 is a cross-sectional view of a composite printed wiring board according to a second embodiment. Composite printed wiring board 1 shown in FIG. 7 basically has a configuration similar to composite printed wiring board 1 shown in FIG. 1 but differs from composite printed wiring board 1 shown in FIG. 1 in that intermediate member 4 is a third printed wiring board 19.

In composite printed wiring board 1 shown in FIG. 7, cavity 7 is formed in third printed wiring board 19 serving intermediate member 4. Furthermore, a through hole 20 and a through hole 41 are formed so as to pass through first printed wiring board 2, third printed wiring board 19, and second printed wiring board 3. A conductor continuous to wiring layers 31 and 23 is formed in the inside of through hole 20 and through hole 41. The conductor electrically connects the wiring layer on a surface of first printed wiring board 2 to the wiring layer on second printed wiring board 3. A void 45 is formed around the periphery of through hole 41.

In composite printed wiring board 1 shown in FIG. 7, the outer periphery of cavity 7 is partially covered with metal. Specifically, on the outer periphery of cavity 7 on the side closer to second printed wiring board 3, copper foil portion 10a is formed on the insulating substrate of second printed wiring board 3. At a portion adjacent to copper foil portion 10a, a surface of the insulating substrate is exposed. The other portion of the outer periphery of the cavity 7 is formed with copper foil 10 of first printed wiring board 2, an electroless plating layer 25 of third printed wiring board 19 serving as intermediate member 4, and bonding layers 5 and 6. Electroless plating layer 25 of third printed wiring board 19 is a layer made of electroless low melting point metal plating, for example, a nickel plating layer. Electroless plating layer 25 may be a layer made of electroless low melting point metal plating and electroless copper plating or a layer made of a layer made of electroless low melting point metal plating and electroless copper plating and a copper foil.

<Configuration of Composite Printed Circuit Board>

Figure 8:
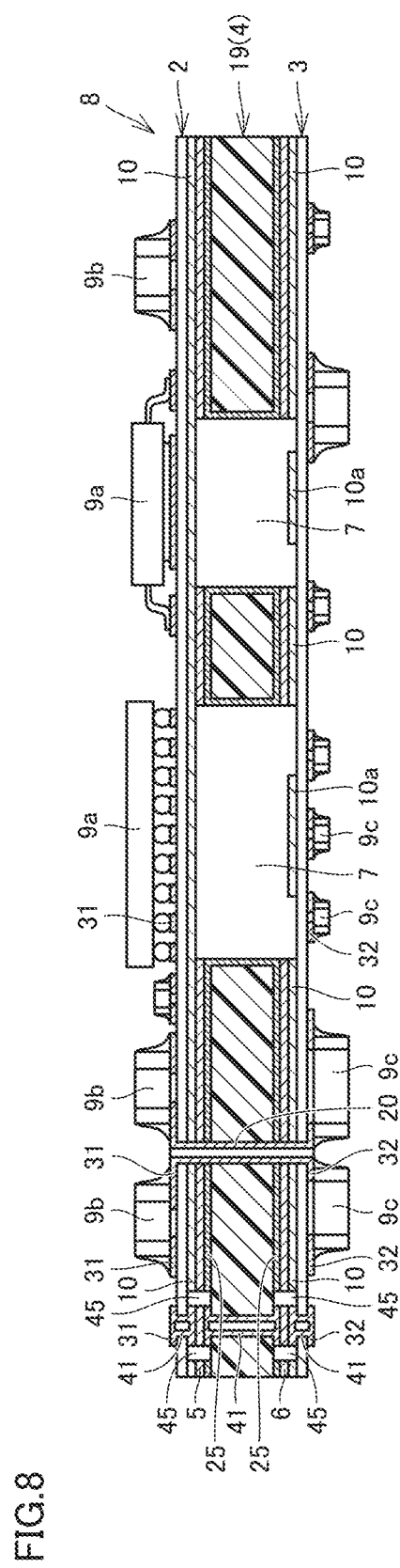
FIG. 8 is a cross-sectional view of a composite printed circuit board having electronic components mounted on the composite printed wiring board shown in FIG. 7.
Figure 9:
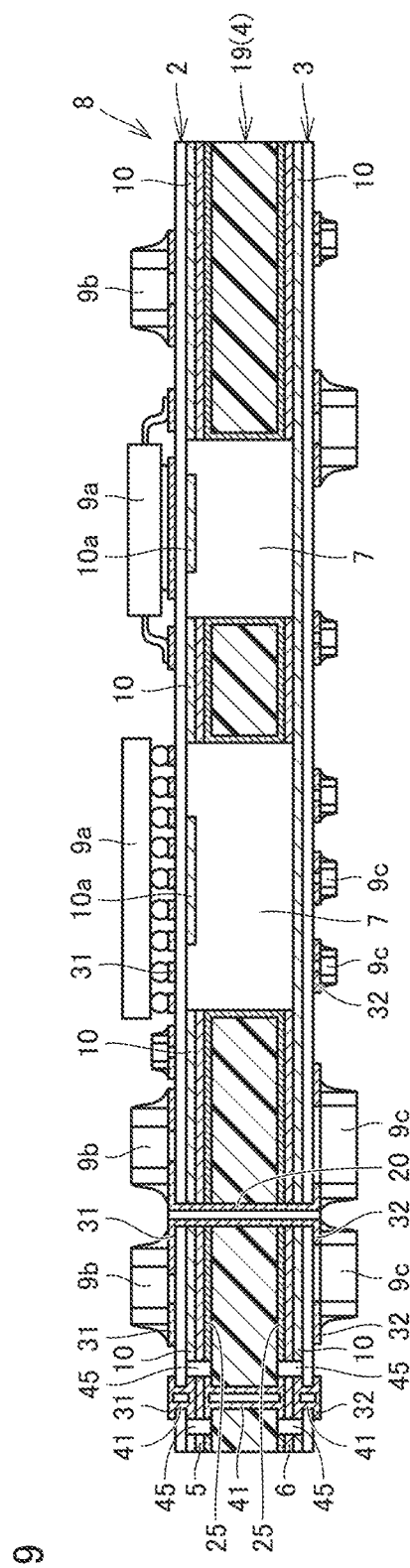
FIG. 9 is a cross-sectional view showing a first modification of the composite printed circuit board shown in FIG. 8.
Figure 10:
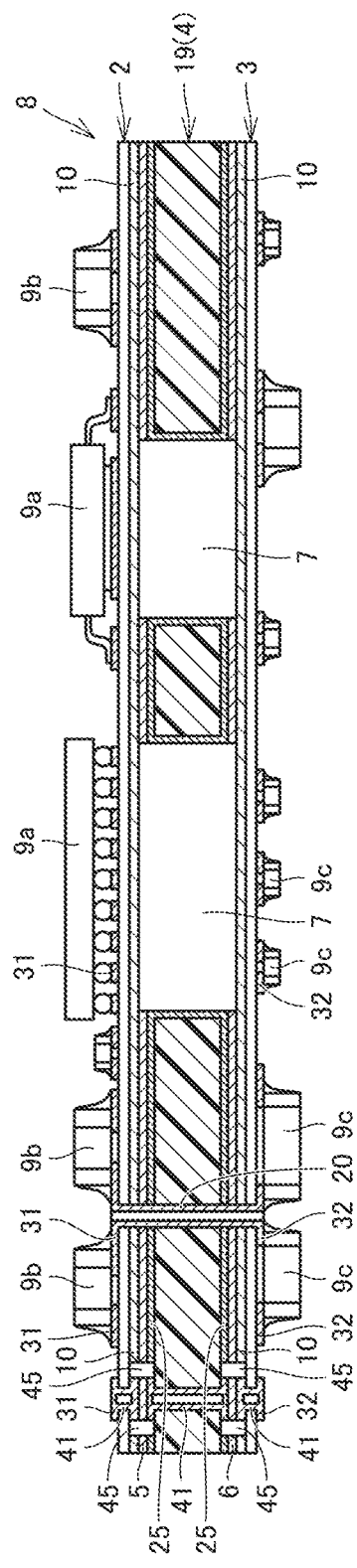
FIG. 10 is a cross-sectional view showing a second modification of the composite printed circuit board shown in FIG. 8.
Figure 11:
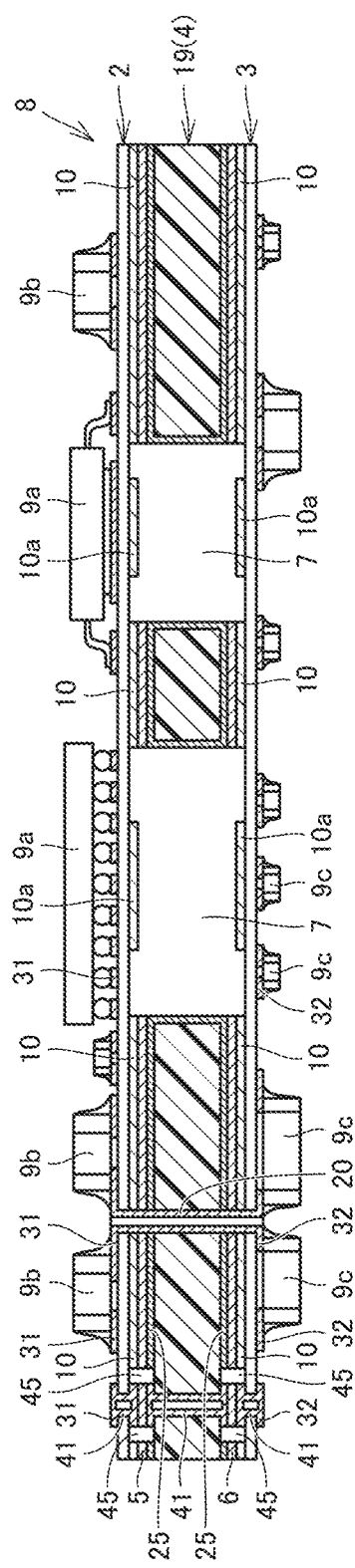
FIG. 11 is a cross-sectional view showing a third modification of the composite printed circuit board shown in FIG. 8.

FIG. 8 is a cross-sectional view of a composite printed circuit board having electronic components mounted on the composite printed wiring board shown in FIG. 7. FIG. 9 to FIG. 11 are cross-sectional views showing first to third modifications of the composite printed circuit board shown in FIG. 8.

Composite printed circuit board 8 shown in FIG. 8 is obtained by mounting electronic components 9a to 9c on wiring layers 31 and 32 of composite printed wiring board 1 shown in FIG. 7. Composite printed circuit board 8 shown in FIG. 8 basically has a configuration similar to composite printed circuit board 8 shown in FIG. 2 but differs from composite printed circuit board 8 shown in FIG. 2 in that third printed wiring board 19 is used as intermediate member 4. In composite printed circuit board 8 shown in FIG. 8, the conductor formed in the inside of through hole 20 and through hole 41 electrically connect a circuit formed in first printed wiring board 2 to a circuit formed in second printed wiring board 3.

Composite printed circuit board 8 shown in FIG. 9 basically has a configuration similar to composite printed circuit board 8 shown in FIG. 8 but differs from composite printed circuit board 8 shown in FIG. 8 in configuration of cavity 7 in third printed wiring board 19. Specifically, on the outer periphery of cavity 7 on the side closer to first printed wiring board 2 in composite printed circuit board 8 shown in FIG. 9, copper foil portion 10a is formed on the insulating substrate of first printed wiring board 2. At a portion adjacent to copper foil portion 10a, a surface of the insulating substrate is exposed. The other portion of the outer periphery of the cavity 7 is formed with copper foil 10 of second printed wiring board 3, electroless plating layer 25 of third printed wiring board 19, and bonding layers 5 and 6.

Composite printed circuit board 8 shown in FIG. 10 basically has a configuration similar to composite printed circuit board 8 shown in FIG. 8 but differs from composite printed circuit board 8 shown in FIG. 8 in configuration of cavity 7 in third printed wiring board 19. Specifically, the outer periphery of cavity 7 in composite printed circuit board 8 shown in FIG. 10 is covered with metal. That is, the outer periphery of cavity 7 is formed with copper foil 10 formed on the insulating substrate of first printed wiring board 2, copper foil 10 of second printed wiring board 3, electroless plating layer 25 of third printed wiring board 19, and bonding layers 5 and 6.

Composite printed circuit board 8 shown in FIG. 11 basically has a configuration similar to composite printed circuit board 8 shown in FIG. 8 but differs from composite printed circuit board 8 shown in FIG. 8 in configuration of cavity 7 in third printed wiring board 19. Specifically, on the outer periphery of cavity 7 on the side closer to first printed wiring board 2 in composite printed circuit board 8 shown in FIG. 11, copper foil portion 10a is formed on the insulating substrate of each of first printed wiring board 2 and second printed wiring board 3. At a portion adjacent to copper foil portion 10a, a surface of the insulating substrate is exposed. The other portion of the outer periphery of the cavity 7 is formed with electroless plating layer 25 of third printed wiring board 19 and bonding layers 5 and 6.

<Method of Manufacturing Composite Printed Wiring Board>

Figure 12:
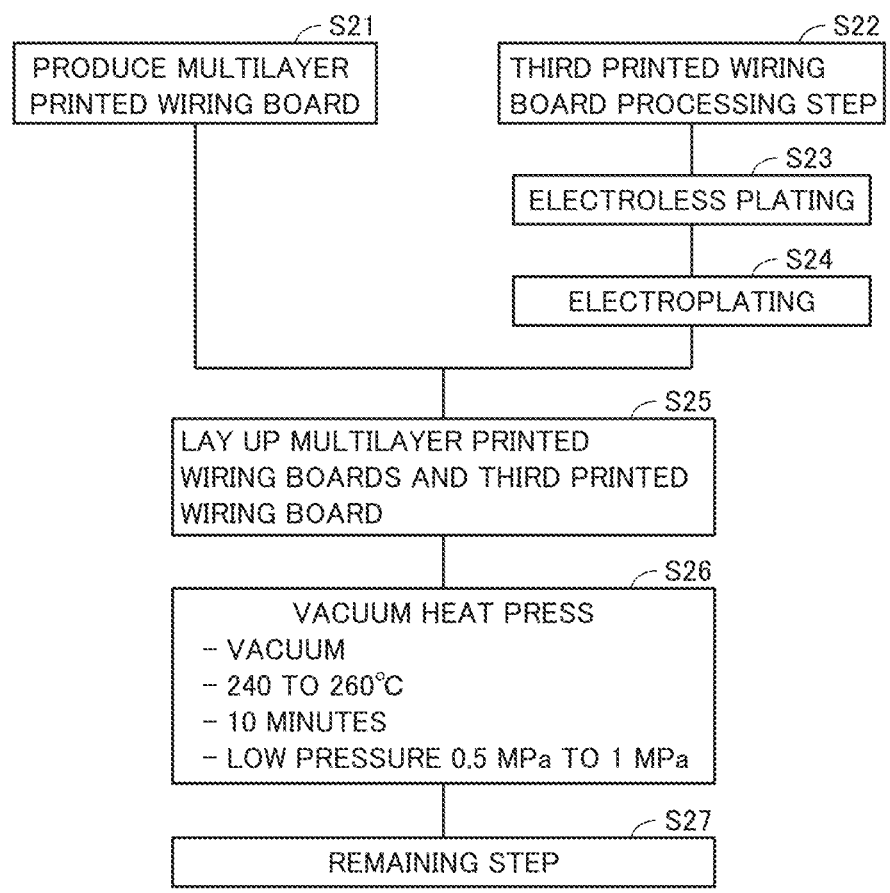
FIG. 12 is a flowchart for explaining a method of manufacturing a composite printed wiring board according to the second embodiment.

FIG. 12 is a flowchart for explaining a method of manufacturing a composite printed wiring board according to the second embodiment. Referring FIG. 12, a method of manufacturing the composite printed wiring board shown in FIG. 7 will be described.

As shown in FIG. 12, first, a step of producing a multilayer printed wiring board (S21) is performed. This step (S21) is basically similar to the step (S11) shown in FIG. 4.

Subsequently, a third printed wiring board processing step (S22) is performed. In this step (S22), the third printed wiring board is processed. Specifically, a double-sided printed wiring board is prepared as third printed wiring board 19. The double-sided printed wiring board has copper foils on its front surface and back surface. The thickness of the copper foil is, for example, 15 μm or more and 40 μm or less and may be 18 μm or 35 μm. A machining process for forming a cavity is performed on the double-sided printed wiring board in the same manner as in the processing step (S13) in FIG. 4.

Subsequently, an electroless plating step (S23) is performed. In this step (S23), for example, nickel electroless plating layer 25 is formed on the entire surface of the double-sided printed wiring board having cavity 7.

Subsequently, an electroplating step (S24) is performed. In this step (S24), a plating layer of low melting point metal is formed on the entire surface of the double-sided printed wiring board. In place of the step (S24), the whole of the double-sided printed wiring board may be immersed in melted low melting point metal and a layer of low melting point metal may be formed on the entire surface of the double-sided printed wiring board. The thickness of the plating layer or the layer of low melting point metal formed in this step (S24) may be 20 μm or less. It is preferable that the surface of the plating layer or the layer of low melting point metal is flat.

Subsequently, a step of laying up the multilayer printed wiring boards and the third printed wiring board (S25) is performed. In this step (S25), first, through hole 41 is formed in each of first printed wiring board 2, third printed wiring board 19, and second printed wiring board 3. Subsequently, first printed wiring board 2, third printed wiring board 19, and second printed wiring board 3 are stacked in this order. After first printed wiring board 2, third printed wiring board 19, and second printed wiring board 3 are stacked, first printed wiring board 2, third printed wiring board 19, and second printed wiring board 3 undergo machining for forming through hole 20. A conductor is formed by plating in the formed through hole 20.

Subsequently, a vacuum heat press step (S26) and a remaining step (S27) are performed. The step (S26) and the step (S27) are similar to the step (S15) and the step (S16) shown in FIG. 4. Composite printed wiring board 1 shown in FIG. 7 is thus obtained.

<Operation Effect>

In composite printed wiring board 1 described above, the intermediate member is third printed wiring board 19. In this case, a vertical electrical bonding path can be formed by through hole 20 and through hole 41 for arranging a conductor electrically connecting first printed wiring board 2 and second printed wiring board 3 in third printed wiring board 19. As a result, the flexibility in circuit design in composite printed wiring board 1 can be increased. In addition, in the vertical electrical bonding path by through hole 41, first printed wiring board 2, third printed wiring board 19, and second printed wiring board 3 do not undergo plating after being stacked. As a result, when cavity 7 in composite printed wiring board 1 has an opening, plating liquid can be prevented from being left in the inside of composite printed wiring board 1.

In the method of manufacturing a composite printed wiring board described above, the intermediate member is third printed wiring board 19. Steps S21 to S25 for preparing a stack includes steps S22 to S24 for forming a layer made of high melting point metal and a layer made of low melting point metal on the surface of third printed wiring board 19 serving as an intermediate member. Through hole 20 and through hole 41 passing through third printed wiring board 19 may be formed in third printed wiring board 19. A conductor electrically connecting first printed wiring board 2 and second printed wiring board 3 may be arranged in the inside of through hole 20 and through hole 41. In this case, the flexibility in circuit design of composite printed wiring board 1 can be increased. In addition, in the vertical electrical bonding path by through hole 41, first printed wiring board 2, third printed wiring board 19, and second printed wiring board 3 do not undergo plating after being stacked. As a result, when cavity 7 in composite printed wiring board 1 has an opening, plating liquid can be prevented from being left in the inside of composite printed wiring board 1.

Third Embodiment

<Configuration of Composite Printed Wiring Board>

Figure 13:
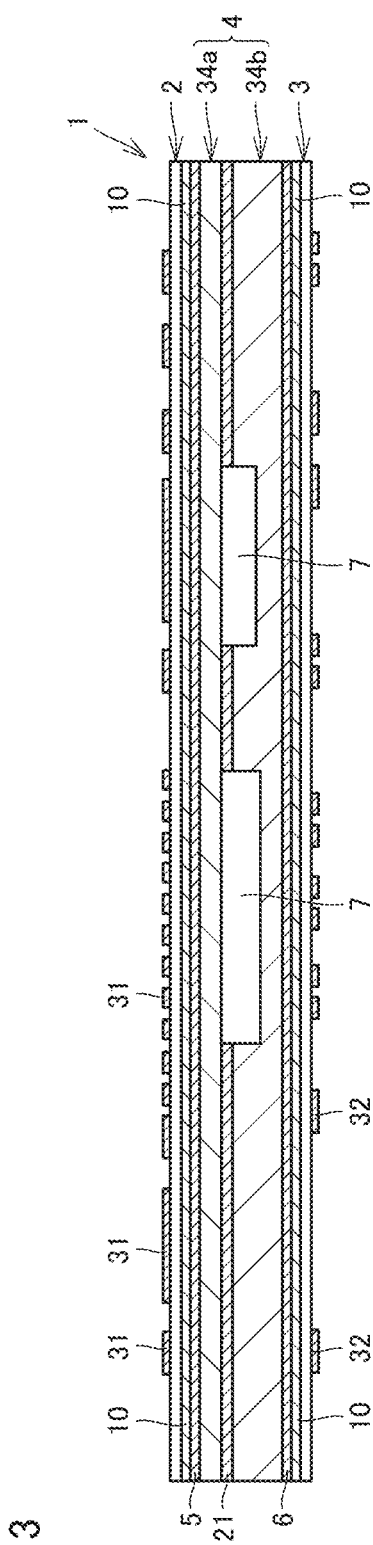
FIG. 13 is a cross-sectional view of a composite printed wiring board according to a third embodiment.

FIG. 13 is a cross-sectional view of a composite printed wiring board according to a third embodiment. Composite printed wiring board 1 shown in FIG. 13 basically has a configuration similar to composite printed wiring board 1 shown in FIG. 1 but differs from composite printed wiring board 1 shown in FIG. 1 in that intermediate member 4 is a structure in which a plurality of members 34a and 34b made of high melting point metal are stacked.

In composite printed wiring board 1 shown in FIG. 13, cavity 7 is formed in member 34b that forms intermediate member 4. On the other hand, a cavity is not formed in member 34a. A bonding layer 21 is formed at a bonding section between member 34a and member 34b. Bonding layer 21 basically has a configuration similar to bonding layers 5 and 6.

<Configuration of Composite Printed Circuit Board>

Figure 14:
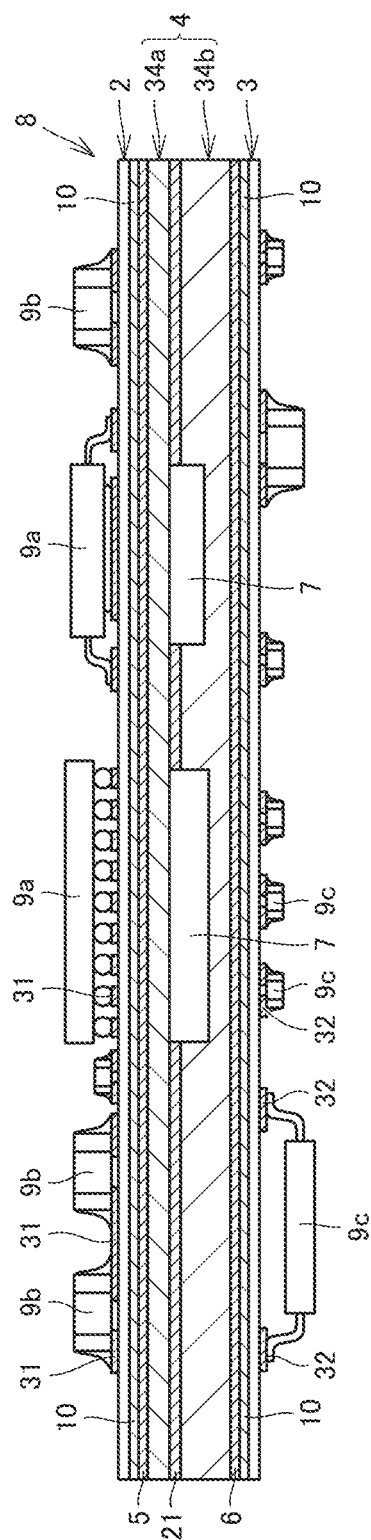
FIG. 14 is a cross-sectional view of a composite printed circuit board having electronic components mounted on the composite printed wiring board shown in FIG. 13.

FIG. 14 is a cross-sectional view of a composite printed circuit board having electronic components mounted on the composite printed wiring board shown in FIG. 13.

Composite printed circuit board 8 shown in FIG. 14 is obtained by mounting electronic components 9a to 9c on wiring layers 31 and 32 of composite printed wiring board 1 shown in FIG. 13. Composite printed circuit board 8 shown in FIG. 14 basically has a configuration similar to composite printed circuit board 8 shown in FIG. 2 but differs from composite printed circuit board 8 shown in FIG. 2 in that a structure in which a plurality of members 34a and 34b made of high melting point metal are stacked is used as intermediate member 4.

<Method of Manufacturing Composite Printed Wiring Board>

Figure 15:
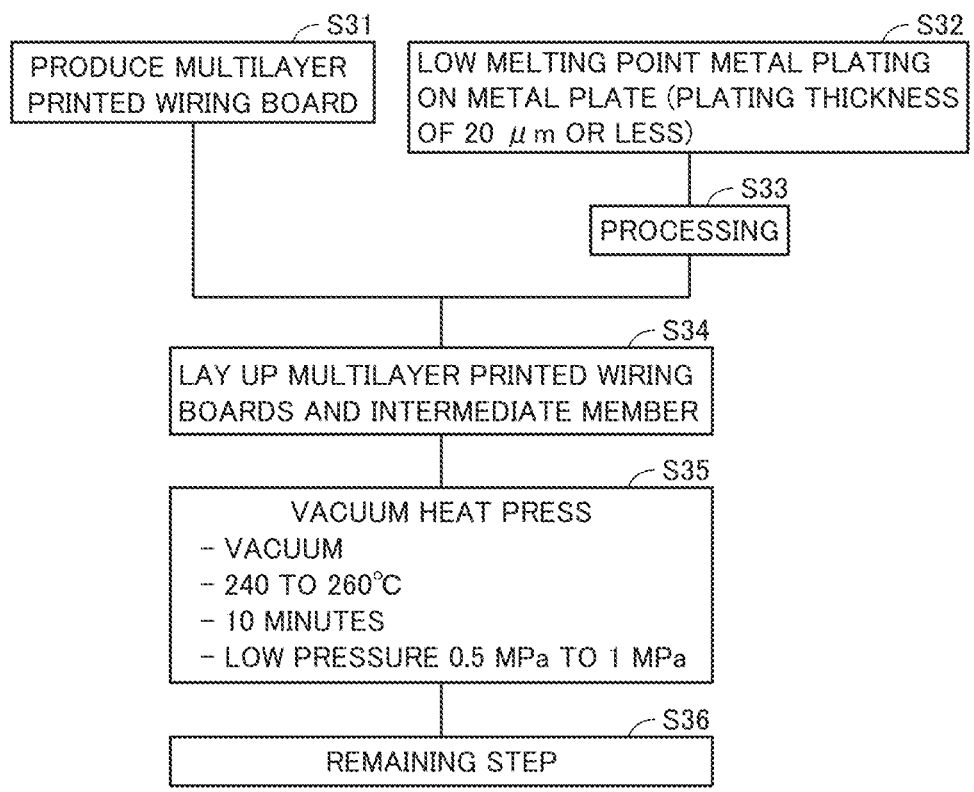
FIG. 15 is a flowchart for explaining a method of manufacturing a composite printed wiring board according to the third embodiment.

FIG. 15 is a flowchart for explaining a method of manufacturing a composite printed wiring board according to the third embodiment.

As shown in FIG. 15, a step of producing a multilayer printed wiring board (S31) is performed. This step (S31) is similar to the step (S11) shown in FIG. 4.

Subsequently, a step of plating a metal plate with low melting point metal (S32) is performed. In this step (S32), plating layers are formed on the front surface and the back surface of a metal plate serving as members 34a and 34b that form intermediate member 4. This step (S32) is basically similar to the step (S12).

Subsequently, a processing step (S33) is performed. In this step (S33), cavity 7 is formed in at least one of members 34a and 34b serving as intermediate member 4. This step (S33) is basically similar to the step (S13) in FIG. 4.

Subsequently, a step of laying up the multilayer printed wiring boards and the intermediate member (S34) is performed. In this step (S34), first printed wiring board 2, members 34a and 34b serving as the intermediate member, and second printed wiring board 3 are stacked in this order.

Subsequently, a vacuum heat press step (S35) and a remaining step (S36) are performed. The step (S35) and the step (S36) are similar to the step (S15) and the step (S16) shown in FIG. 4. Composite printed wiring board 1 shown in FIG. 13 is thus obtained.

<Operation Effect>

In composite printed wiring board 1 described above, intermediate member 4 is a structure in which a plurality of members 34a and 34b are stacked. In this case, the position of cavity 7 can be changed for each of a plurality of members 34a and 34b that form intermediate member 4. Hence, the flexibility in determining the arrangement of cavity 7 in intermediate member 4 can be increased according to purposes such as a circulation path for a coolant and a waveguide. Members 34a and 34b may be formed of any material other than high melting point metal.

In the method of manufacturing a composite printed wiring board described above, intermediate member 4 includes a plurality of member 34a and 34b made of high melting point metal. Steps S31 to S34 for preparing a stack includes steps S32 and S34 of forming a layer made of low melting point metal on the surfaces of a plurality of members 34a and 34b and thereafter stacking a plurality of members. In this case, cavity 7 can be formed for each of a plurality of members 34a and 34b, and the arrangement of cavity 7 can be changed for each of members 34a and 34b.

Fourth Embodiment

<Method of Manufacturing Composite Printed Wiring Board>

Figure 16:
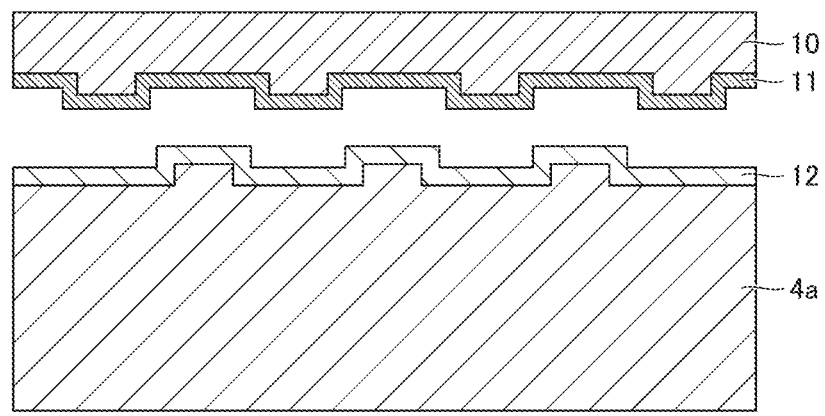
FIG. 16 is a diagram for explaining a method of manufacturing the composite printed wiring board shown in FIG. 6 according to a fourth embodiment.
Figure 17:
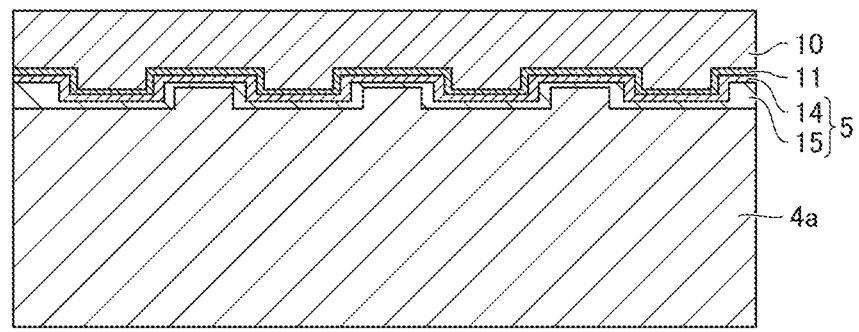
FIG. 17 is a diagram for explaining a method of manufacturing the composite printed wiring board shown in FIG. 6 according to the fourth embodiment.

FIG. 16 and FIG. 17 are diagrams for explaining a method of manufacturing the composite printed wiring board shown in FIG. 6 according to a fourth embodiment. Plating layer 11 and plating layer 12 in the diagram shown in FIG. 16 to FIG. 17 basically have a configuration similar to plating layer 11 and plating layer 12 shown in FIG. 5 except that a depressed and protruding shape is formed at a contact region between plating layer 11 and plating layer 12. This is different from the contact region between plating layer 11 and plating layer 12 in FIG. 5, which is a flat surface. Referring to FIG. 16 to FIG. 17, a method of manufacturing a composite printed wiring board in the fourth embodiment will be described.

As shown in FIG. 16, in the steps (S11) to (S14) in FIG. 4, it is preferable that plating layer 11 is formed on a surface of copper foil 10 of first printed wiring board 2 shown in FIG. 5. Plating layer 12 is formed on a surface of metal plate 4a serving as intermediate member 4 shown in FIG. 5. That is, in FIG. 5, intermediate member 4 includes metal plate 4a and plating layer 12. Here, prior to formation of plating layer 11, the surface of copper foil 10 is partially etched. Furthermore, prior to formation of plating layer 12, the surface of metal plate 4a is partially etched. This etching is performed at a plurality of places periodically spaced apart from each other with respect to a direction along the surfaces of copper foil 10 and metal plate 4*a*. Thus, a depressed and protruding shape is formed in copper foil 10 and metal plate 4*a*, in which depressions and projections are periodically repeated such that the etched away regions are depressions and the other regions are projections. Plating layer 11 is formed on the surface having the depressed and protruding shape of copper foil 10. Plating layer 12 is formed on the surface having the depressed and protruding shape of metal plate 4*a*.

As described above, the depressed and protruding shape is also formed on the surfaces of plating layers 11 and 12. The depressed and protruding shape formed on plating layers 11 and 12 is preferably such that the difference in size in the thickness direction between the depression and the protrusion is 5 µm or more and 50 µm or less. Here, it is also preferable that the depressed and protruding shape is formed on the surfaces of copper foil 10 and metal plate 4*a* such that the depressed shape of plating layer 11 and the protruding shape of plating layer 12 are fitted together, and the depressed shape of plating layer 12 and the protruding shape of plating layer 11 are fitted together.

Referring to FIG. 17, in the step (S15) in FIG. 4, bonding layer 5 is obtained, in which the depressed and protruding shape is provided at the contact region by stacking and bonding first printed wiring board 2 and intermediate member 4 as shown in FIG. 5 such that the depressed shape of plating layer 11 and the protruding shape of plating layer 12 are fitted together, and the depressed shape of plating layer 12 and the protruding shape of plating layer 11 are fitted together. Furthermore, bonding layer 6 (see FIG. 6) having the depressed and protruding shape at the contact region is obtained by stacking and bonding second printed wiring board 3 and intermediate member 4 in the same manner as described above. The configuration shown in FIG. 17 in which plating layer 11 and bonding layer 5 both have the depressed and protruding shape and are bonded to each other corresponds to the configuration of the region surrounded by the dotted line in FIG. 6 in which plating layer 11 and bonding layer 5 are bonded.

<Operation Effect>

In composite printed wiring board 1 described above, the depressed and protruding shape may be provided on bonding layers 5 and 6. In this case, shear strain exerted on hard and brittle intermetallic compound 14 to 17 in FIG. 6 can be alleviated and strain resistance can be improved.

In the method of manufacturing a composite printed wiring board described above, in steps S11 to S14 for preparing a stack, the depressed and protruding shape is formed on a surface opposed to intermediate member 4 of first printed wiring board 2, for example, a surface having plating layer 11 of high melting point metal and a surface having plating layer 12 of low melting point metal in intermediate member 4. In step S15 for forming a bonding layer, a stack structure with the depressed and protruding shape in a fitted state is obtained. As a result, bonding layers 5 and 6 having the depressed and protruding shape as shown in FIG. 17 are obtained. In this case, shear strain exerted on hard and brittle intermetallic compound 14 to 17 in FIG. 6 can be alleviated and strain resistance can be improved.

Fifth Embodiment

<Configuration of Composite Printed Wiring Board>

Figure 18:
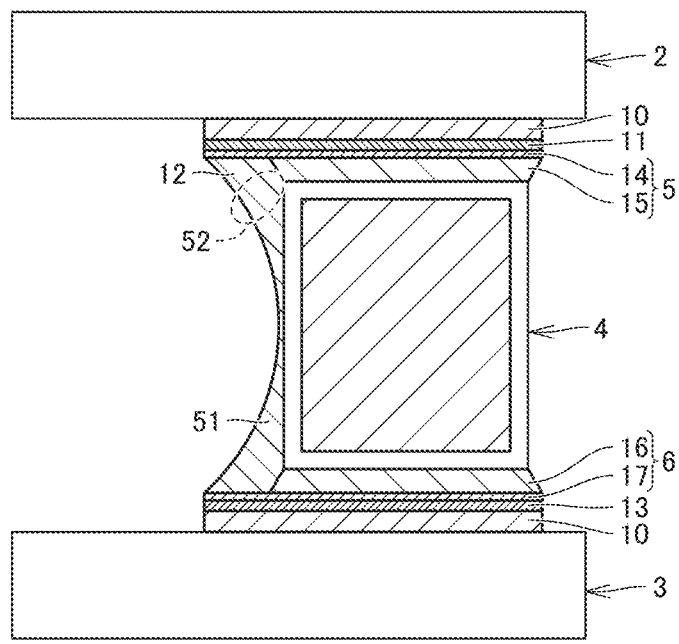
FIG. 18 is a cross-sectional view of a part of the composite printed wiring board according to a fifth embodiment.

FIG. 18 is a cross-sectional view of a part of the composite printed wiring board according to a fifth embodiment. The composite printed wiring board shown in FIG. 18 basically has a configuration similar to composite printed wiring board 1 shown in FIG. 1 but differs from composite printed wiring board 1 shown in FIG. 1 in structure of the connection of first printed wiring board 2 and second printed wiring board 3 to intermediate member 4.

In the drawing showing a part of the composite printed wiring board shown in FIG. 18, the width of copper foil 10 and plating layer 11 provided on first printed wiring board 2 is larger than the width of intermediate member 4. That is, the size of copper foil 10 and plating layer 11 representing the distance from the left end surface to the right end surface in FIG. 18 is larger than that of intermediate member 4. Similarly, the width of copper foil 10 and plating layer 13 provided on second printed wiring board 3 is larger than the width of intermediate member 4. That is, the size of copper foil 10 and plating layer 13 representing the distance from the left end surface to the right end surface in FIG. 18 is larger than that of intermediate member 4. In a two-dimensional view, in a region overlapping with copper foils 10 and plating layers 11 and 13 on the outside of intermediate member 4, plating layer 12 of low melting point metal such as tin having a fillet shape 51 is formed so as to protrude to the outside of intermediate member 4. That is, plating layer 12 having fillet shape 51 is formed so as to protrude to the outside in a two-dimensional view of bonding layers 5 and 6 between intermediate member 4 and plating layers 11 and 13. Plating layer 12 protruding to the outside of bonding layers 5 and 6 is curved such that its outer edge has fillet shape 51. Fillet shape 51 at the outer edge of plating layer 12 is formed like a curve that approaches intermediate member 4 at the center in the direction connecting first printed wiring board 2 and second printed wiring board 3 and departs from intermediate member 4 as the distance from the center increases.

Figure 19:
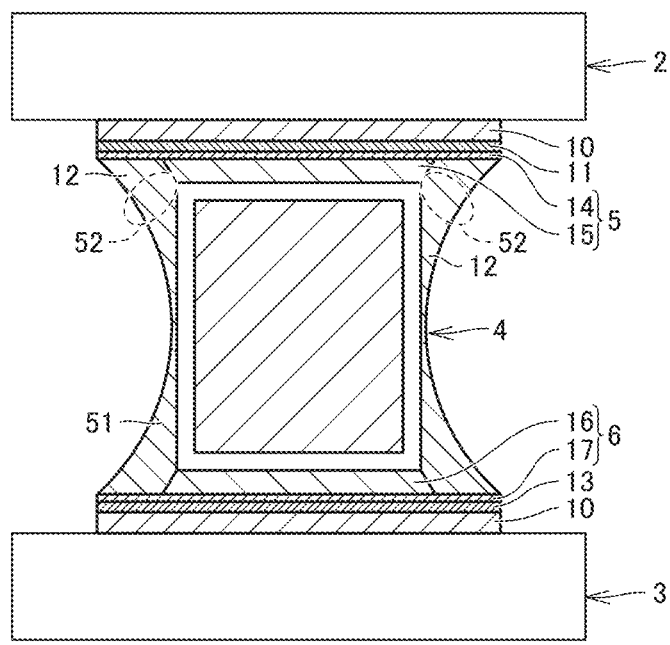
FIG. 19 is a cross-sectional view of a first modification of a part of the composite printed wiring board according to the fifth embodiment.

FIG. 19 is a cross-sectional view of a first modification of a part of the composite printed wiring board according to the fifth embodiment. The composite printed wiring board shown in FIG. 19 basically has a configuration similar to a part of the composite printed wiring board shown in FIG. 18 but differs from FIG. 18 in configuration of copper foil 10, plating layers 11 and 13, and plating layer 12 of low melting point metal. Specifically, in a part of the composite printed wiring board shown in FIG. 19, copper foils 10 and plating layers 11 and 13 extend lengthwise and plating layers 12 having fillet shape 51 are arranged on both of the left side and the right side of intermediate member 4. In this respect, FIG. 19 differs from FIG. 18 in which copper foils 10 and plating layers 11 and 13 extend lengthwise and plating layer 12 having fillet shape 51 is arranged on only one side, that is, for example, on the left side of intermediate member 4. Whether to form plating layer 12 only on one side of intermediate member 4 as shown in FIG. 18 or to form plating layers 12 on both left and right sides of intermediate member 4 as shown in FIG. 19 is determined as appropriate, for example, according to desired bonding strength.

Figure 20:
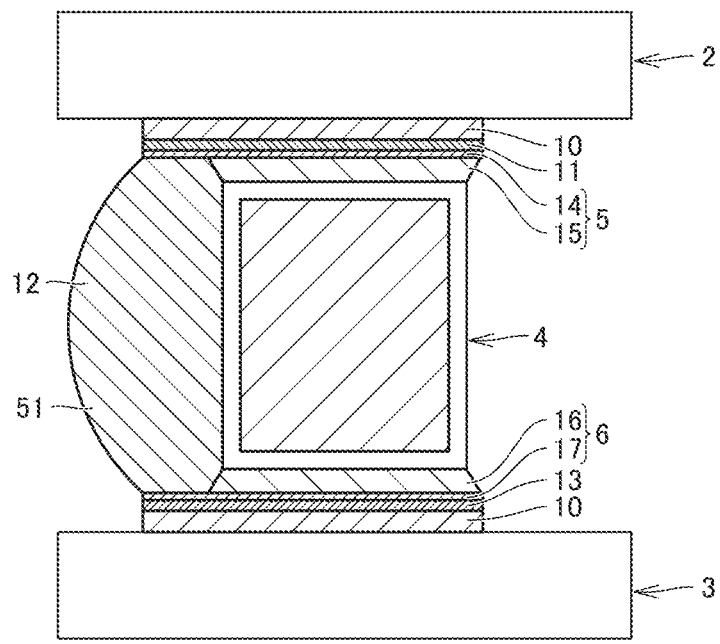
FIG. 20 is a cross-sectional view of a second modification of a part of the composite printed wiring board according to the fifth embodiment.

FIG. 20 is a cross-sectional view of a second modification of a part of the composite printed wiring board according to the fifth embodiment. The composite printed wiring board shown in FIG. 20 basically has a configuration similar to a part of the composite printed wiring board shown in FIG. 18 except that low melting point metal is further added to the outside of the curved outer edge of plating layer 12. Specifically, for example, on the outside of plating layer 12 having fillet shape 51 protruding toward intermediate member 4 as shown in FIG. 18, the same low melting point metal material as plating layer 12 or a low melting point metal material of a different kind is additionally formed. Thus, with the original portion and the added portion as a whole, plating layer 12 has an outer edge curved in the opposite direction to that in FIG. 18 and FIG. 19. This plating layer 12 has its outer edge formed like a curve that departs from intermediate member 4 at the center in the direction connecting first printed wiring board 2 and second printed wiring board 3 and approaches intermediate member 4 as the distance from the center increases.

FIG. 20 shows a configuration in which low melting point metal is added to plating layer 12 in FIG. 18. However, low melting point metal may be added to the outside of plating layers 12 located on both left and right sides of intermediate member 4 in FIG. 19. Alternatively, plating layer 12 may be formed only on the right side of intermediate member 4 and low melting point metal may be added to this plating layer 12.

<Method of Manufacturing Composite Printed Wiring Board>

In manufacturing the composite printed wiring board in FIG. 18 to FIG. 20, first printed wiring board 2 prepared in steps S11 to S14 for preparing a stack includes copper foil 10 and plating layer 11, and second printed wiring board 3 includes copper foil 10 and plating layer 13. Copper foil 10 and plating layer 11 of first printed wiring board 2 are prepared such that the size of the outer periphery is larger than that of intermediate member 4. Copper foil 10 and plating layer 13 of second printed wiring board 3 are prepared such that the size of the outer periphery is larger than that of intermediate member 4. Furthermore, plating layer 12 of low melting point metal is formed on intermediate member 4.

Thus, copper foils 10 and plating layers 11 and 13 are formed so as to extend to the outside of plating layer 12. In a region overlapping with intermediate member 4 in a two-dimensional view, therefore, intermetallic compound 14 to 17 can be formed, which is a mutual diffusion layer of plating layer 12 of low melting point metal and high melting point metal on first printed wiring board 2 and second printed wiring board 3. However, intermetallic compound 14 to 17 is unable to be formed in a region on the outside of intermediate member 4 in a two-dimensional view. This is because plating layer 12 formed on intermediate member 4 fails to reach plating layers 11 and 13 and metal diffusion does not occur between plating layer 12 and plating layers 11 and 13. Accordingly, plating layer 12 attempting mutual diffusion with plating layer 11 on the left side of intermediate member 4 in FIG. 18 does not reach plating layer 11 and fails in mutual diffusion and then protrudes to the outside of intermediate member 4. Therefore, in step S15 of forming a bonding layer, plating layer 12 having fillet shape 51 on the outside of intermediate member 4 in a two-dimensional view is formed.

When a low melting point metal material is further added to plating layer 12 as shown in FIG. 20, step S15 of forming a bonding layer is performed, and then an additional low melting point metal material is supplied after bonding layer 5 formed of intermetallic compound 14 and 15 is formed.

<Operation Effect>

In composite printed wiring board 1 described above, plating layer 12 is formed as a low melting point metal layer having fillet shape 51 on the outside of bonding layers 5 and 6 in a two-dimensional view. With provision of fillet shape 51, fillet shape 51 of plating layer 12 and a region adjacent thereto serves as a stress concentration portion 52 surrounded by a circle in the drawing. This can suppress exertion of a large stress on bonding layers 5 and 6 having hard and brittle intermetallic compound 14 to 17. Therefore, shear strain exerted on hard and brittle bonding layers 5 and 6 can be alleviated and strain resistance can be improved. Because of the improvement in strain resistance of bonding layers 5 and 6, separation of bonding layers 5 and 6 can be suppressed when a process exerting a large stress, such as boring and routing, is performed on a partial region in composite printed wiring board 1.

In the method of manufacturing a composite printed wiring board described above, first printed wiring board 2 and second printed wiring board 3 prepared in the step of preparing a stack include copper foils 10 and plating layers 11 and 13 as conductive layers. First printed wiring board 2 and second printed wiring board 3 are prepared such that the size of the outer periphery of the conductive layers is larger than that of intermediate member 4. In the step of forming bonding layers 5 and 6, plating layer 12 as a low melting point metal layer having fillet shape 51 is formed on the outside of intermediate member 4 in a two-dimensional view. Since copper foils 10 and plating layers 11 and 13 are formed such that the size in the right-left direction in FIG. 18 is larger than that of intermediate member 4, plating layer 12 having fillet shape 51 is formed on the outside of intermediate member 4. As a result, the configuration of composite printed wiring board 1 described above is obtained in which plating layer 12 is formed on the outside of bonding layers 5 and 6 that bond plating layer 12 on intermediate member 4 and plating layers 11 and 13. Therefore, shear strain exerted on hard and brittle bonding layers 5 and 6 can be alleviated and strain resistance can be improved, as described above.

Although embodiments of the present disclosure have been described above, embodiments disclosed here should be understood as being illustrative rather than being limitative in all respects. The scope of the present disclosure is shown in the claims, and it is intended that all modifications that come within the meaning and range of equivalence to the claims are embraced here.

REFERENCE SIGNS LIST 1 composite printed wiring board, 2 first printed wiring board, 3 second printed wiring board, 4 intermediate member, 4a metal plate, 5, 6, 21 bonding layer, 7 cavity, 8 composite printed circuit board, 9a to 9c electronic component, 10 copper foil, 10a copper foil portion, 11, 12, 13 plating layer, 14, 15, 16, 17 intermetallic compound, 19 third printed wiring board, 20, 41 through hole, 25 electroless plating layer, 31, 32 wiring layer, 34a, 34b member, 40 arrow, 45 void, 51 fillet shape, 52 stress concentration portion.

The invention claimed is:

1. A composite printed wiring board comprising:
a first printed wiring board having a wiring layer which formed on a first surface of the first printed wiring board and on which an electronic component is to be soldered;
an intermediate member stacked on a second surface of the first printed wiring board and having a cavity;
a second printed wiring board stacked on a second surface of the intermediate member which is on an opposite side of the intermediate member from a first surface of the intermediate member that is opposed to the first printed wiring board; and
a bonding layer being a mutual diffusion layer containing high melting point metal and low melting point metal, the bonding layer being arranged at a bonding section between the first printed wiring board and the intermediate member and at a bonding section between the second printed wiring board and the intermediate member, the bonding layer being arranged in a region overlapping with the intermediate member in a two-dimensional view, wherein a melting point of the bonding layer is higher than a melting point of the low melting point metal, and the melting point of the bonding layer is higher than a solder reflowing temperature for soldering the electronic component on the wiring layer, wherein there exists no layer that contains the low melting point metal and that does not contain the high melting point metal, in the region overlapping with the intermediate member in the two-dimensional view, between the first printed wiring board and the intermediate member and between the second printed wiring board and the intermediate member, and wherein the intermediate member is a third printed wiring board.

2. The composite printed wiring board according to claim 1, wherein the intermediate member is a structure in which a plurality of members are stacked.

3. The composite printed wiring board according to claim 1, wherein the cavity has an outer periphery covered with metal.

4. The composite printed wiring board according to claim 1, wherein the cavity has an outer periphery partially covered with metal.

5. The composite printed wiring board according to claim 1, wherein the bonding layer has a depressed and protruding shape.

6. The composite printed wiring board according to claim 1, wherein a layer of the low melting point metal having a fillet shape is formed outside the bonding layer in a two-dimensional view.

7. The composite printed wiring board according to claim 1, further comprising:
at least one straight through hole that extends completely through each of the first printed wiring board, the second printed wiring board, and the third printed wiring board.

8. The composite printed wiring board according to claim 7, further comprising:
a void formed around the periphery of the at least one through hole.

9. The composite printed wiring board according to claim 1, wherein:
a wiring layer on the first printed wiring board is electrically connected to a wiring layer on the second printed wiring board via a through hole in the third printed wiring board.

10. The composite printed wiring board according to claim 1, wherein:
at least one of an insulator layer in the first printed wiring boards and an insulator layer in the second printed wiring boards is exposed in a region directly facing the cavity.

11. The composite printed wiring board according to claim 1, wherein:
at least one of an entirety of a region on the first printed wiring board directly facing the cavity and an entirety of a region on the second printed wiring board directly facing the cavity is completely covered with metal.

12. The composite printed wiring board according to claim 1, wherein:
each of the first, second, and third printed wiring boards includes at least two wiring layers and an insulator layer.

* * * * *